(12) United States Patent
Tanaka

(10) Patent No.: US 9,153,744 B2
(45) Date of Patent: Oct. 6, 2015

(54) LIGHT EMITTING ELEMENT

(71) Applicant: Nichia Corporation, Anan-shi (JP)

(72) Inventor: Hidetoshi Tanaka, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/485,299

(22) Filed: Sep. 12, 2014

(65) Prior Publication Data

US 2015/0076550 A1    Mar. 19, 2015

(30) Foreign Application Priority Data

Sep. 13, 2013 (JP) .................................. 2013-190151
Sep. 11, 2014 (JP) .................................. 2014-185094

(51) Int. Cl.
*H01L 33/00* (2010.01)
*H01L 33/38* (2010.01)
*H01L 33/62* (2010.01)

(52) U.S. Cl.
CPC ............... *H01L 33/38* (2013.01); *H01L 33/62* (2013.01)

(58) Field of Classification Search
CPC ............................... H01L 33/62; H01L 33/38
USPC ............................................ 257/99, E33.062
See application file for complete search history.

(56) References Cited

U.S. PATENT DOCUMENTS

| 6,777,805 B2 * | 8/2004 | Uemura et al. ............... 257/745 |
| 2005/0052878 A1 * | 3/2005 | Yamada et al. ............... 362/460 |
| 2009/0140280 A1 * | 6/2009 | Shen et al. ....................... 257/98 |
| 2011/0227120 A1 * | 9/2011 | Yang et al. ....................... 257/98 |
| 2012/0049238 A1 * | 3/2012 | Tanaka et al. ................... 257/99 |
| 2013/0037839 A1 * | 2/2013 | Kazama ........................... 257/98 |

FOREIGN PATENT DOCUMENTS

| JP | 2001-237461 A | 8/2001 |
| JP | 2011-086856 A | 4/2011 |
| JP | 2011-114240 A | 6/2011 |
| JP | 2012-069934 A | 4/2012 |

* cited by examiner

*Primary Examiner* — Vongsavanh Sengdara
(74) *Attorney, Agent, or Firm* — Foley & Lardner LLP

(57) ABSTRACT

A light-emitting element includes a semiconductor portion, an upper electrode and a lower electrode. The upper electrode includes a plurality of first external connectors, a plurality of second external connectors, a first inward elongated portion extending from each of the first external connectors, a second inward elongated portion extending from each of the second external connectors, a first outward elongated portion extending from each of the first external connectors toward a side opposite to a side where the second external connectors are disposed, and connecting two first external connectors next to each other, and a second outward elongated portion extending from each of the second external connectors toward a side opposite to a side where the first external connectors are disposed, and connecting two second external connectors next to each other.

17 Claims, 5 Drawing Sheets

LIGHT EMITTING ELEMENT

CROSS-REFERENCE TO RELATED APPLICATION

This application claims priority to Japanese Patent Application No. 2013-190151, filed on Sep. 13, 2013 and Japanese Application No. 2014-185094, filed on Sep. 11, 2014. The entire disclosure of Japanese Patent Application No. 2013-190151 and No. 2014-185094 are hereby incorporated herein by reference.

BACKGROUND OF THE INVENTION

1. Field of the Invention

The present invention relates to a light-emitting element.

2. Description of Related Art

Conventionally, a light-emitting element is required to have uniform luminance distribution over a light extraction surface thereof, and thus current density on the light extraction surface is required to be uniform. For example, a light-emitting element having an upper electrode, a lower electrode, and a semiconductor layer therebetween has been disclosed, wherein the upper electrode disposed on a light extraction surface side includes a plurality of external connectors and elongated portions extending from the external connectors; and spreading current over the light extraction surface through the elongated portions reduces non-uniformity of current that flows in a region between the upper and the lower electrodes, that is, within the semiconductor layer, and thus provides uniform luminance distribution over the light extraction surface (see, e.g., JP 2012-69934 A and JP 2011-114240 A).

However, an electrode disposed on a light extraction surface of a light-emitting element in a conventional manner has many regions in which no elongated portions which extend from the external connectors are disposed. Thus, there has been a tendency for current density to widely vary over the light extraction surface. Simply increasing the number of elongated portions can hardly reduce the uneven distribution of the current density on the light extraction surface, and thus requiring further consideration on the arrangement of the electrodes.

Accordingly an object of the present invention is to further reduce uneven distribution of current density on the light extraction surface.

SUMMARY OF THE INVENTION

A light-emitting element according to the present invention includes a semiconductor portion, an upper electrode disposed on an upper surface of the semiconductor portion, the upper surface being on a light-extraction side, and a lower electrode disposed on a lower surface of the semiconductor portion. As viewed from above the semiconductor portion, the upper electrode includes a plurality of first external connectors arranged on a first virtual straight line, a plurality of second external connectors arranged on a second virtual straight line which is substantially parallel to the first virtual straight line, a first inward elongated portion extending from each of the plurality of first external connectors beyond a third line which is substantially parallel to both the first virtual straight line and the second virtual straight line and divides a region between the first virtual straight line and the second virtual straight line in half, a second inward elongated portion extending from each of the plurality of second external connectors beyond the third virtual straight line, a first outward elongated portion extending from each of the plurality of first external connectors toward a side opposite to a side where the plurality of second external connectors are disposed, and connecting two adjacent first external connectors, and a second outward elongated portion extending from each of the plurality of second external connectors toward a side opposite to a side where the plurality of first external connectors are disposed, and connecting two adjacent second external connectors.

According to the embodiments, uneven distribution of current density on the light extraction surface can be further reduced, and thus a light-emitting element which has an improved luminous distribution on a light extraction surface can be provided.

DETAILED DESCRIPTION OF EMBODIMENTS

Embodiments of the present invention will be described below with reference to the drawings. It is understood that the embodiments described below discuss the light-emitting elements merely by way of example in order to embody the technical thought of the present invention, and that the present invention is not intended to be limited to any particular light-emitting element described below. Furthermore, unless otherwise expressly stated, a size, a material, a shape, relative arrangement, and other properties of a constituent member are not provided for limiting the scope of the present invention to merely those described herein, but are provided by way of example for purposes of illustration.

First Embodiment

Figure 1:
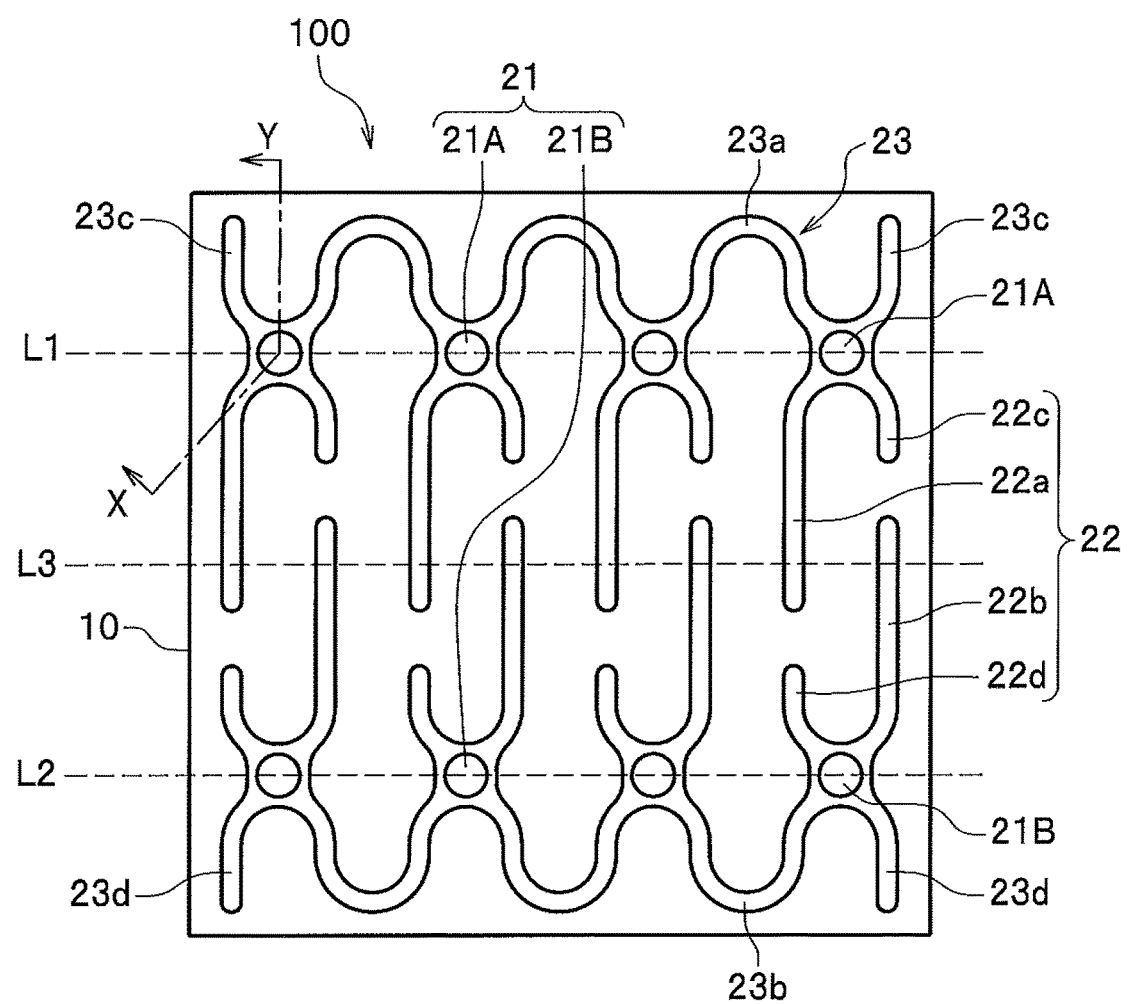
FIG. 1 is a schematic plan view illustrating a light-emitting element according to a first embodiment.
Figure 2:
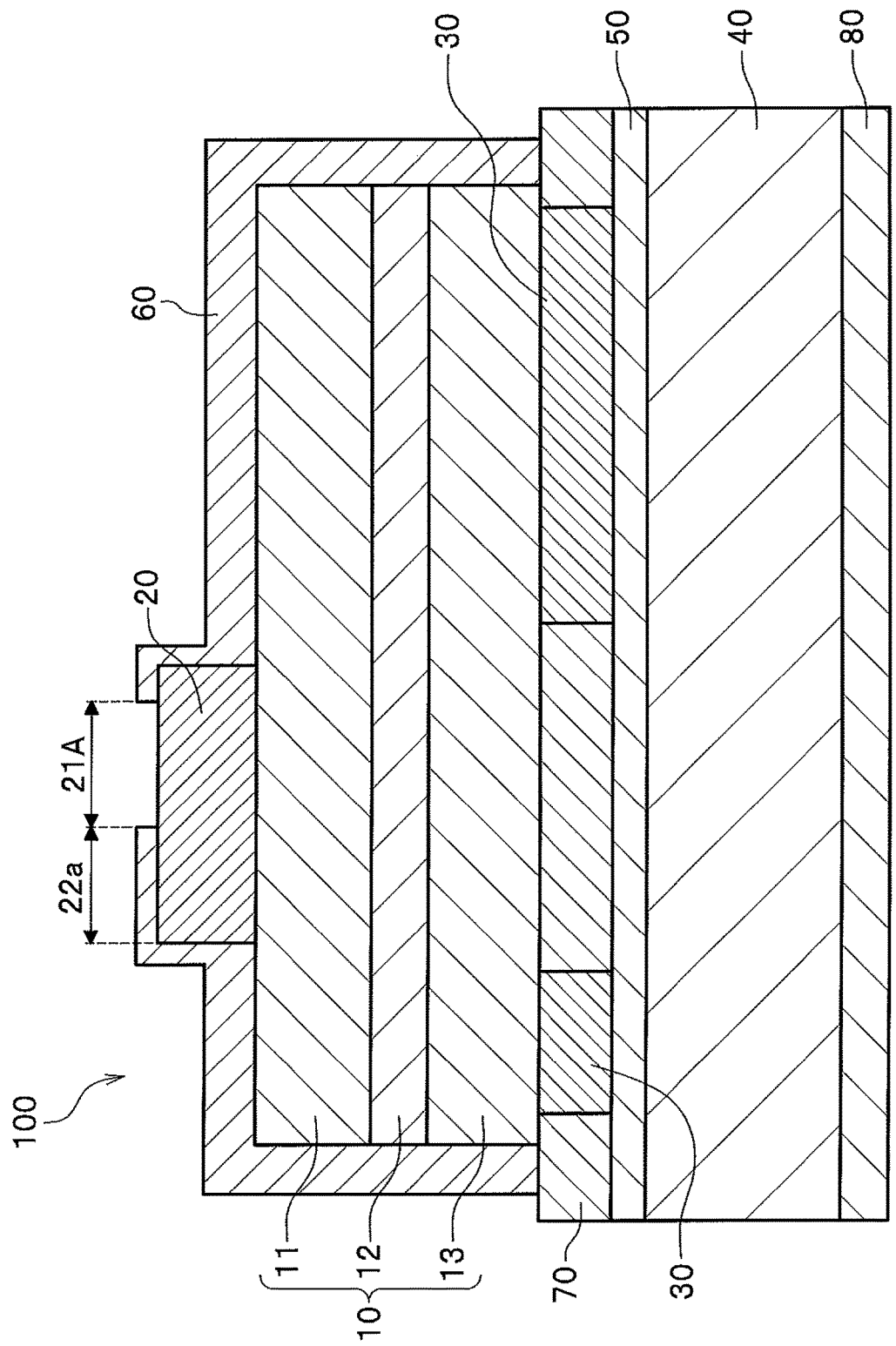
FIG. 2 is a schematic cross-sectional view taken along plane X-Y of the light-emitting element according to the first embodiment.
Figure 5A:
FIG. 5A is a color bar, an upper portion of the color bar represents a higher luminance.
Figure 5B:
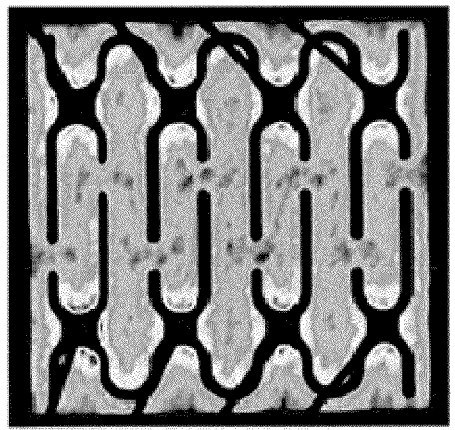
FIG. 5B is a diagram illustrating luminance distribution on the light extraction surface of a light-emitting element according to Example 1.
Figure 5C:
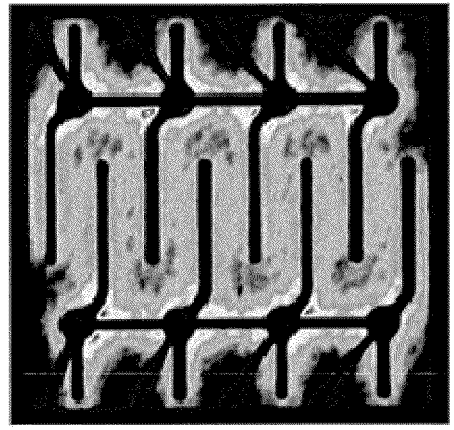
FIG. 5C is a diagram illustrating luminance distribution on the light extraction surface of a light-emitting element according to Comparative Example 1.

A light-emitting element 100 according to a first embodiment will be described below with reference to FIGS. 1 and 2. FIG. 1 is a schematic plan view illustrating the light-emitting element 100 according to the first embodiment of the present invention (structure below the semiconductor portion 10 shown in FIG. 1 is not shown in FIG. 1). FIG. 2 is a schematic cross-sectional view, taken along plane X-Y shown in FIG. 1, illustrating the light-emitting element 100 according to first embodiment of the present invention. FIG. 5B is a diagram illustrating luminance distribution on the light extraction surface of a light-emitting element according to Example 1 by using a chromameter. FIG. 5C is a diagram illustrating luminance distribution on the light extraction surface of a light-emitting element according to Comparative Example 1 by using a chromameter.

The light-emitting element 100 according to the first embodiment includes a semiconductor portion 10, an upper electrode 20 disposed on an upper surface, which serves as a light extraction surface, of the semiconductor portion 10, and a lower electrode 30 disposed on a lower surface of the semiconductor portion 10. As viewed from above the semiconductor portion 10, the upper electrode 20 includes a plurality of first external connectors 21A arranged on a first virtual straight line L1; a plurality of second external connectors 21B arranged on a second virtual straight line L2 substantially parallel to the first virtual straight line L1, a first inward elongated portion 22a extending from each of the first external connectors 21A beyond a third line L3 which is substantially parallel to both the first virtual straight line L1 and the second virtual straight line L2 and which divides a region between the first virtual straight line L1 and the second virtual straight line L2 in half; a second inward elongated portion 22b extending from each of the second external connectors 21B over the third line L3; a first outward elongated portion 23a extending from each of the first external connectors 21A toward a side opposite to a side where the second external connectors 21B are disposed, and connecting two first external connectors 21A next to each other; and a second outward elongated portion 23b extending from each of the second external connectors 21B toward a side opposite to a side where the first external connectors 21A are disposed, and connecting two second external connectors 21B next to each other. The first virtual straight line L1, the second virtual straight line L2, and the third virtual straight line L3 are virtual lines to facilitate understanding.

With this arrangement, in the inner region which is between the first external connectors 21A and the second external connectors 21B, that is a center region of the light emitting element 100, the first inward elongated portions 22a and the second inward elongated portions 22b, alternately and respectively extending from the first external connectors 21A and the second external connectors 21B, are densely arranged, and therefore current density can be increased in this region. Further, also in the regions located outer side of the external connectors 21 (21A, 21B), the outward elongated portions 23 (23a, 23b) each connecting two adjacent external connectors 21 are arranged in a surrounding manner to respective outer regions between the two adjacent external connectors 21 where the current cannot be easily dispersed. Thus, the dispersion of the current can be facilitated and therefore the current density can be increased as in the center region. Thus, the difference in the current density between the inner and outer regions of the external connectors 21 on the light extraction surface can be reduced, which allows obtaining of a light-emitting element 100 where the deviation of luminance distribution within the light extraction surface has been improved as shown in FIG. 5B.

Main components included in the light-emitting element 100 will now be described.

Semiconductor Portion 10

The semiconductor portion 10 is a light-emitting member in the light-emitting element 100. As shown in FIG. 2, the semiconductor portion 10 has the upper electrode 20 and the lower electrode 30 which form a pair of positive and negative electrodes. The upper electrode 20 and the lower electrode 30 face each other with the semiconductor portion 10 therebetween. The light extraction surface of the semiconductor portion 10 has a rectangular shape as viewed from the upper surface side, and generally has a square shape with a size of approximately 2 mm×2 mm in this embodiment. The semiconductor portion 10 may have a stacked structure of a second semiconductor layer 13, a light-emitting layer 12, and a first semiconductor layer 11 in this order from bottom to top.

The first semiconductor layer 11 is formed in an upper portion of the semiconductor portion 10 and to be connected to the upper electrode 20. The second semiconductor layer 13 is formed in a lower portion of the semiconductor portion 10 and to be connected to the lower electrode 30. The first semiconductor layer 11 and the second semiconductor layer 13 have opposite polarities. In the present embodiment, the first semiconductor layer 11 is made of n-type semiconductor material, and the second semiconductor layer 13 is made of p-type semiconductor material. Current which is dispersed in the upper electrode 20 flows into the lower electrode 30 through the semiconductor portion 10.

The materials of the first semiconductor layer 11 and the second semiconductor layer 13 are not specifically limited and various appropriate materials can be employed. For example, in the present embodiment, $In_xAl_yGa_{1-x-y}N$ (where $0 \leq x < 1$, and $0 \leq y < 1$) is employed as a material to form the first semiconductor layer 11 and the second semiconductor layer 13 respectively.

Upper Electrode 20

The upper electrode 20 serves to supply the current to the semiconductor portion 10. In this specification, the upper electrode 20 serves as an n-type electrode (negative electrode) of a pair of positive and negative electrodes. As shown in FIG. 2, the upper electrode 20 is formed on the upper surface of the semiconductor portion 10 and faces the lower electrode 30 via the semiconductor portion 10. As shown in FIG. 1, the upper electrode 20 includes the external connectors 21 (21A and 21B), and the inward elongated portions 22 (22a to 22d) and the outward elongated portions 23 (23a to 23d), respectively extending from respective external connectors 21.

In order to reduce uneven distribution in the current density over the light extraction surface, the upper electrode 20 is preferably arranged with a rotational symmetry with respect to the center of the light extraction surface. This allows for a symmetric arrangement of the upper electrode 20 on the light extraction surface, and thus current dispersed through the upper electrode 20 can be made substantially uniform over the light extraction surface. Accordingly, uneven distribution of the current density over the light extraction surface can be reduced and the luminance distribution within the light extraction surface can be improved.

External Connector 21

The external connector 21 is a portion of the upper electrode 20 and to be connected to a conductive wire or the like, which is electrically connected to an external power source. As shown in FIG. 1, the external connector 21 includes, on the upper surface of the semiconductor portion 10, a plurality of first external connectors 21A arranged on a first virtual straight line L1, and a plurality of second external connectors 21B arranged on a second virtual straight line L2 which is substantially parallel to the first virtual straight line L1. Further, in the present embodiment, the upper electrode 20 and the semiconductor portion 10 are covered with a first protection film 60. Accordingly, an upper portion of the external connector 21 is opened from the first protection film 60 in a circular shape so that a large portion of the upper surface of the external connector 21 is exposed to outside. An electrically conductive wire or the like is bonded to the exposed portion of the external connectors 21 to establish electrical connection to the external power source. In this arrangement, the first virtual straight line L1 and the second virtual straight line L2 are preferably aligned with each other substantially parallel to one of the sides of the periphery of the light-emitting element 100.

Moreover, the external connectors 21 are preferably arranged at regular intervals on the first virtual straight line L1 or on the second virtual straight line L2. This arrangement allows for a regular distance between two adjacent external connectors 21, so that uneven dispersion of the current among the external connectors 21 can be prevented, and thus a non-uniform luminance distribution among the external connectors 21 within the light extraction surface can be improved.

Also it is preferable to arrange the first external connectors 21A and the second external connectors 21B are symmetrically arranged with respect to the third virtual straight line L3. Accordingly, on the light extraction surface of the light emitting element 100, the external connectors 21, to which the current to be supplied, can be arranged symmetrically, so that uneven distribution of the current density can be further reduced.

An excessively large diameter of the external connectors 21 which are exposed to outside (i.e., diameter of pad electrodes) may result in absorption of light by the external connectors 21, so that the diameter is preferably as small as possible.

Inward Elongated Portion 22

The inward elongated portion 22 is a portion of the upper electrode 20 and to disperse the current supplied to the external connector 21 to a region of the light extraction surface of the light emitting element 100 which is located between the first external connectors 21A and the second external connectors 21B, that is, a center region. As shown in FIG. 1, the inward elongated portions 22 include first inward elongated portions 22a which respectively extend from the first external connectors 21A over the third virtual straight line L3, and second inward elongated portions 22b which respectively extend from the second external connectors 21B over the third virtual straight line L3. In other words, in the central region of the light-emitting element 100, the tip portions of the first inward elongated portions 22a and of the second inward elongated portions 22b face one another along the third line L3, so that the electrodes are densely arranged. This arrangement allows current to be spread from the external connectors 21 through the inward elongated portions 22a and 22b facing one another, and can thus provide an electrode arrangement in which current spreading is improved in a region distant from the external connectors 21, where current cannot be easily spread. Accordingly, current can be efficiently spread over the central region. Preferably, the third virtual straight line L3 is substantially parallel to one side of the periphery of the light-emitting element 100, and divides the area of the light extraction surface generally in half. That is, it is preferable that the third line L3 be a center line.

Furthermore, as shown in FIG. 1, the inward elongated portions 22 can include third inward elongated portions 22c which respectively extend from the first external connectors 21A toward the third virtual straight line L3 a short of the third virtual straight line L3, and fourth inward elongated portions 22d which respectively extend from the second external connectors 21B toward the third virtual straight line L3 a short of the third virtual straight line L3. Thus, a region ahead of the tip of each of the first inward elongated portions 22a and of the second inward elongated portions 22b, distant from the external connectors 21, where current cannot be easily spread, can be provided with the third inward elongated portions 22c and the fourth inward elongated portions 22d relatively near to the external connectors 21, and thus capable of spreading current more easily. Accordingly, current can be spread around the tips of the first inward elongated portions 22a and of the second inward elongated portions 22b through the third inward elongated portions 22c and the fourth inward elongated portions 22d, and thus a region where current is only slightly spread can be improved in current spreading. As a result, non-uniformity of current density between the inward elongated portions 22 arranged on the light extraction surface can be further reduced.

Preferably, the first inward elongated portions 22a and the second inward elongated portions 22b are arranged so as not to contact or overlap with the third inward elongated portions 22c and the fourth inward elongated portions 22d. This prevents current concentration due to contact or overlap with the inward elongated portions.

Preferably, the inward elongated portions 22 extend from the external connectors 21 obliquely relative to the first virtual straight line L1 or to the second virtual straight line L2, and then perpendicularly to the first virtual straight line L1 or to the second virtual straight line L2. This prevents an arrangement in which the inward elongated portions 22 are arranged close to one another near the external connectors 21 where current tends to concentrate, and thus current can be spread over a wider region. Moreover, since the inward elongated portions 22 are each arranged with a curved shape and without an angled corner, current concentration due to an angled corner can also be prevented.

Preferably, the first inward elongated portions 22a and the fourth inward elongated portions 22d, and the second inward elongated portions 22b and the third inward elongated portions 22c are arranged so as to respectively extend on the same virtual lines, and face each other in a perpendicular direction to the first virtual straight line L1 and to the second virtual straight line L2. Thus, the distance between the electrodes of the first inward elongated portions 22a and the fourth inward elongated portions 22d, and the distance between the electrodes of the second inward elongated portions 22b and the third inward elongated portions 22c are each minimized in a perpendicular direction to the first virtual straight line L1 and to the second virtual straight line L2. Accordingly, an electrode arrangement can be provided in which current spreading is efficiently improved in a region between the electrodes.

Outward Elongated Portion 23

The outward elongated portions 23 are provided in the upper electrode 20 for spreading the current supplied to the external connectors 21 over a region outward from the external connectors 21 on the light extraction surface of the light-emitting element 100. As shown in FIG. 1, the upper electrode 20 includes first outward elongated portions 23a which respectively extend from the first external connectors 21A toward a side opposite to a side where the second external connectors 21B are disposed and which each connect two first external connectors 21A next to each other, and the second outward extensionelongated portions 23b which respectively extend from the second external connectors 21B toward a side opposite to a side where the first external connectors 21A are disposed and which each connect two second external connectors 21B next to each other. That is, an outer region where only outward extensionelongated portion from each of the external connectors 21 is not enough to spread current, in particular, an outer region between each two external connectors 21 next to each other, can be arranged so as to be surrounded by a first outward elongated portion 23a or by a second outward elongated portion 23b to supplement current by corresponding external connectors 21. Thus, current density on the light extraction surface can be improved as with the case of the inward elongated portions 22 described above.

Moreover, the outward elongated portions 23 can include third outward elongated portions 23c, which respectively extend from the outermost first external connectors 21A of the plurality of first external connectors 21A toward a side which is outside of the outermost first external connectors 21A and opposite to the side where the second external connectors 21B are disposed, and fourth outward elongated portions 23d, which respectively extend from the outermost second external connectors 21B of the plurality of second external connectors 21B toward a side which is outside of the outermost second external connectors 21B and opposite to the side where the first external connectors 21A are disposed. This arrangement allows the third outward elongated portions 23c and the fourth outward elongated portions 23d to be disposed in the corners on the upper surface of the semiconductor portion 10, distant from the outermost external connectors 21A and 21B, where current cannot be easily spread, and thus current from the external connectors 21 can be efficiently spread.

Moreover, if the connecting portions of respective pairs of the first outward elongated portions 23a and the second outward elongated portions 23b are near the first external connectors 21A and the second external connectors 21B, the supplied current results in higher density around the first external connectors 21A and around the second external connectors 21B. Thus, the first outward elongated portions 23a and the second outward elongated portions 23b are preferably arranged so as to run near the periphery of the light-emitting element 100. This arrangement prevents current from resulting in higher density than necessary around the first external connectors 21A and around the second external connectors 21B, and thus non-uniformity of current density between the outward elongated portions 23 can be further reduced.

Lower Electrode 30

The lower electrode 30 supplies current to the semiconductor portion 10. Here, the lower electrode 30 serves as a p-type electrode (positive electrode) of the pair of positive and negative electrodes provided in the light-emitting element 100. As shown in FIG. 2, the lower electrode 30 is formed on the lower surface of the semiconductor portion 10, and faces the upper electrode 20 via the semiconductor portion 10.

As shown in FIG. 2, the lower electrode 30 is formed in a multiple-part configuration over the support substrate 40 via a junction layer 50. Preferably, the upper electrode 20 and the lower electrode 30 do not overlap with each other as viewed from above. Due to such a positional relationship between the upper electrode 20 and the lower electrode 30 of the light-emitting element 100, a current flow between the upper electrode 20 and the lower electrode 30 will not take a shortest path in the semiconductor layers in a film-thickness direction, and thus current is wide spread over the surface. Therefore, light is emitted relatively uniformly in the entire semiconductor portion 10, and light extraction efficiency is improved.

Preferably, the area of the lower electrode 30 is greater than the area of the upper electrode 20. Due to such a relationship between the areas of the upper electrode 20 and of the lower electrode 30, the light-emitting element 100 can provide a large area for the current injection region, and light emission efficiency can thus be improved. Moreover, heat dissipation performance of heat generated at the time of light emission can also be improved, and thus heat dissipation performance of the light-emitting element 100 can be improved.

Although there is no specific limitation on the thickness of the lower electrode 30, the thickness of the lower electrode 30 is preferably, for example, in a range from 0.05 µm to 0.5 µm from a viewpoint of electrical conductivity. The material used for the lower electrode 30 may be Ni, Au, W, Pt, Ti, Al, Ir, Rh, RhO, Ag, or other substances. Among these, Rh, Ag, Ni, or Au each having a high reflectivity, and a multilayer film having layers of Pt, Ti, Ni, and Ag stacked from bottom to top in this order, are preferable for use.

Support Substrate 40

The support substrate 40 is a substrate on which the members such as the electrodes and the semiconductor portion 10 are deposited. As shown in FIG. 2, the support substrate 40 is formed on a rectangular plate. The support substrate 40 is shown as having a larger area than the semiconductor portion 10 in FIG. 2; however, the support substrate 40 and the semiconductor portion 10 may have a same area. Although there is no specific limitation on the thickness of the support substrate 40, the thickness of the support substrate 40 is preferably, for example, in a range from 50 µm to 500 µm from a viewpoint of heat dissipation performance.

The material used for the support substrate 40 may be a laminate of metal and ceramic such as Si, SiC, AlN, AlSiC, Cu—W, Cu—Mo, Cu-diamond, or other substances. Among these, Si and Cu—W are preferable for use, which are inexpensive and easy to manufacture a chip.

Junction Layer 50

The junction layer 50 is an electrically conductive layer for bonding the lower electrode 30 and a second protection film 70 to the support substrate 40, and for electrically connecting the lower electrode 30 and a back metalization layer 80 (described later) via the support substrate 40. The junction layer 50 is formed on the top of the support substrate 40 as shown in FIG. 2.

As shown in FIG. 2, the junction layer 50 is formed over substantially the entire upper surface of the support substrate 40. There is no specific limitation on the thickness of the junction layer 50; however, the thickness of the junction layer 50 is preferably, for example, in a range from 3 µm to 4 µm from a viewpoint of bonding performance and electrical conductivity. The material used for the junction layer 50 may include at least Sn, Pb, or another substance having a low melting point, and may be a metal such as Ti, Pt, Au, Sn, Au, Ag, Cu, Bi, Pb, Zn, or an alloy thereof. Among these, a multilayer film having layers of TiSi2, Pt, Au, AuSn, Au, and Pt stacked from bottom to top in this order is preferable for use.

First Protection Film 60

The first protection film 60 protects the upper electrode 20 and the semiconductor portion 10 from physical damage such as a current short circuit, a buildup of dust or dirt. As shown in FIG. 2, the first protection film 60 is formed over substantially the entire upper surfaces of the upper electrode 20 and the semiconductor portion 10, except for a circular opening above each of the openings of the first external connectors 21A and of the second external connectors 21B as shown in FIG. 2. Thus, a large portion of each of the first external connectors 21A and the second external connectors 21B is externally exposed.

There is no limitation on material of the first protection film 60, and various materials may be used. In this embodiment, $SiO_2$ is used. Although there is no specific limitation on the thickness of the first protection film 60, the thickness of the first protection film 60 is preferably, for example, in a range from 0.2 µm to 0.5 µm.

Second Protection Film 70

The second protection film 70 protects the lower electrode 30 and the semiconductor portion 10 from physical damage such as a current short circuit. As shown in FIG. 2, the second protection film 70 is formed in a region on the junction layer 50 next to the lower electrode 30.

Although there is no specific limitation on the thickness of the second protection film 70, the thickness of the second protection film 70 is preferably, for example, in a range from 0.2 µm to 0.5 µm. The material used for the second protection film 70 may be Ti, Al, $SO_2$, $ZrO_2$, or other substances. Among these, a multilayer film having layers of Ti and SiO$_2$ stacked from bottom to top in this order is preferable for use.

A metal film having a high reflectivity, and having a Ti layer and a Pt layer stacked from bottom to top in this order, may be further formed on the lower surface side of the second protection film 70, that is, on the junction layer 50 side. By forming such a metal film under the lower surface of the second protection film 70, the light-emitting element 100 can provide a higher reflectivity, and thus light extraction efficiency can be improved.

Backside Metalization Layer 80

The backside metalization layer 80 serves as an ohmic electrode in the light-emitting element 100. As shown in FIG. 2, the backside metalization layer 80 is formed on the support substrate 40 such that the backside metalization layer 80 faces the junction layer 50.

The backside metalization layer 80 is formed over substantially the entire lower surface of the support substrate 40 as shown in FIG. 2. Although there is no specific limitation on the thickness of the backside metalization layer 80, the thickness of the backside metalization layer 80 is preferably, for example, in a range from 0.5 μm to 0.6 μm from a viewpoint of electrical conductivity. Preferably, the material used for the backside metalization layer 80 is a multilayer film having layers of Au, AuSn, Pt, Ti, SiO$_2$ stacked from bottom to top in this order.

Method of Manufacturing Light-Emitting Element

A method of manufacturing the light-emitting element 100 according to a first embodiment of the present invention will be described below briefly. The method for manufacturing the light-emitting element 100 includes forming a semiconductor portion, forming a lower electrode, forming a second protection film, forming a junction layer, bonding, forming an upper electrode, and forming a first protection film. The steps will be described below in a one-by-one manner. Note that the configuration of the light-emitting element 100 is the same as that described above, and thus the explanation thereof will be omitted.

<Forming Semiconductor Portion>

In forming a semiconductor portion, the semiconductor portion 10 including a first semiconductor layer 11, a light-emitting layer 12, and a second semiconductor layer 13 are formed on a foreign substrate. In the step of forming the semiconductor portion, a gas containing a predetermined semiconductor material, a dopant, and the like is supplied onto a surface of the foreign substrate made of sapphire and the like to form the first semiconductor layer 11, the light-emitting layer 12, and the second semiconductor layer 13 in this order.

<Forming Lower Electrode>

In forming a lower electrode, the lower electrode 30 is formed on the semiconductor portion 10. In the forming the lower electrode, with the use of a resist, a mask corresponding to the lower electrode 30 is formed on a surface of the second semiconductor layer 13 of the semiconductor portion 10, and an electrode material is deposited by way of spattering or the like to form the lower electrode 30.

<Forming Second Protection Film>

In forming a second protection film, the second protection film 70 is formed on the semiconductor portion 10. In the forming the second protection film, with the use of a resist, a mask corresponding to the second protection film 70 is formed on a surface of the second conductivity-type semiconductor layer of the semiconductor portion 10, and an insulation film material is deposited by way of spattering or the like to form the second protection film 70.

<Forming Junction Layer>

In forming a junction layer, the junction layer 50 is formed on the semiconductor portion 10, the upper electrode 20, and the second protection film 70. In the forming the junction layer, a conductive film material is deposited by way of spattering or the like, on the semiconductor portion 10, the upper electrode 20, and the second protection film 70 to form the junction layer 50.

<Bonding>

In bonding, the foreign substrate having the semiconductor portion 10 is bonded to a support substrate 40. In the bonding, the support substrate 40 on which the junction layer 50 described above has been formed is prepared, and the junction layer of the support substrate 40 and the junction layer of the foreign substrate are bonded together to be integrated to each other. The foreign substrate is then removed. A reduction in the thickness of the support substrate 40 is performed after the bonding, which allows a reduction in the size of the light-emitting element 100.

<Forming Upper Electrode>

In forming an upper electrode, the upper electrode 20 is formed on the semiconductor portion 10. In the forming the upper electrode, with the use of a resist, a mask corresponding to the electrode is formed on a surface of the first semiconductor layer 11 of the semiconductor portion 10, and an electrode material is deposited by way of spattering or the like to form the upper electrode 20. The resist is then removed to form a region on which the upper electrode 20 is not formed. Although not shown, a dimpled region may be formed on the upper surface of the semiconductor portion 10 before forming the upper electrode 20.

<Forming First Protection Film>

In forming a first protection film, the first protection film 60 is formed on the semiconductor portion 10. In the forming the first protection film, an insulation film material is deposited on a surface of the semiconductor portion 10 by way of spattering or the like to form the first protection film 60. Regions of the first protection film 60 corresponding to the external connectors 21 of the upper electrode 20 are removed to expose the external connectors 21.

Second Embodiment

Figure 3:
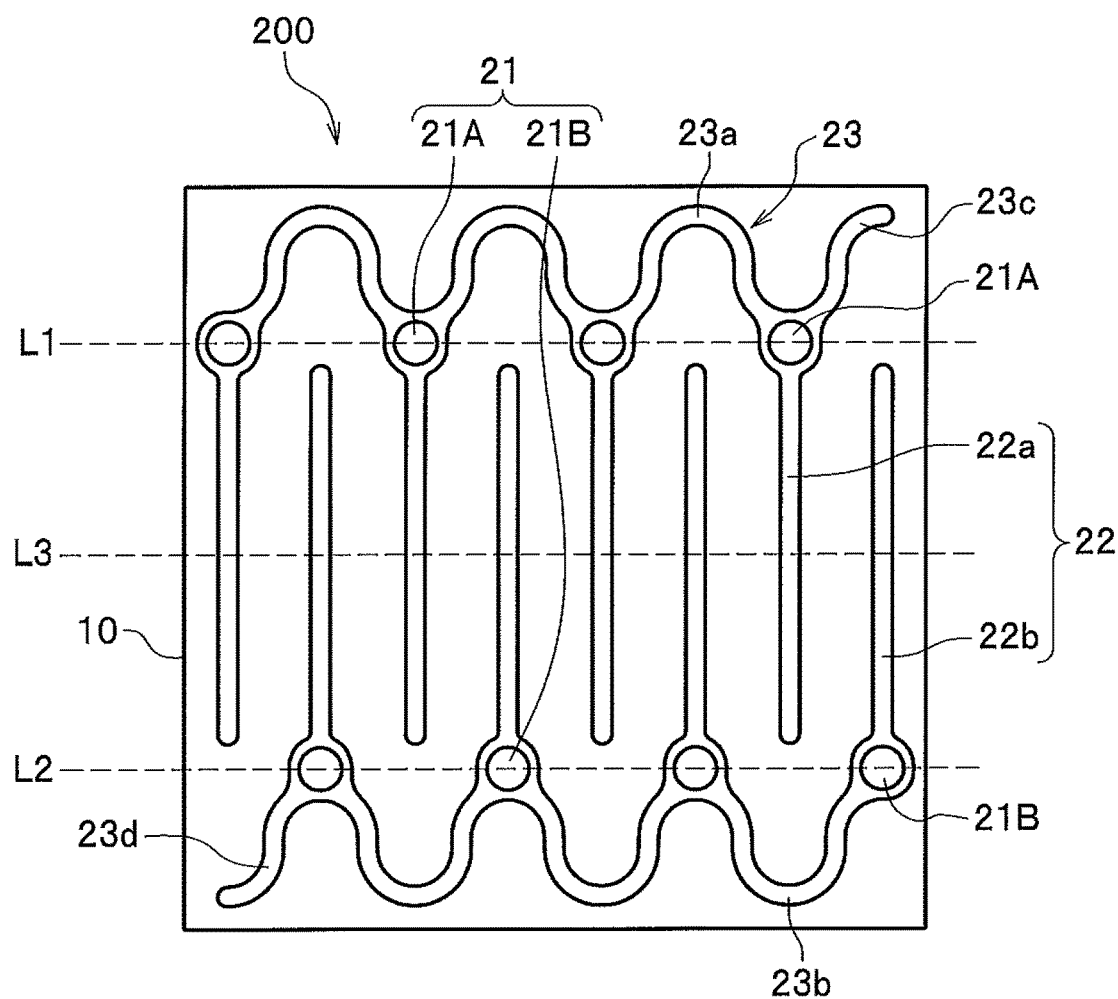
FIG. 3 is a schematic plan view illustrating a light-emitting element according to a second embodiment.

A light-emitting element 200 according to a second embodiment will be described below with reference to FIG. 3. FIG. 3 is a plan view illustrating the light-emitting element 200. The light-emitting element 200 differs from the light-emitting element 100 only in the arrangement of the upper electrode 20.

The upper electrode 20 of the light-emitting element 200 includes, as shown in FIG. 3, the external connectors 21 (21A and 21B), the inward elongated portions 22 (22a and 22b), and the outward elongated portions 23 (23a to 23d). When compared with the upper electrode 20 of the light-emitting element 100, the upper electrode 20 of the light-emitting element 200 is substantially the same as that of the light-emitting element 100 except that the third inward elongated portions 22c and the fourth inward elongated portions 22d are not provided.

As shown in FIG. 3, the first external connectors 21A and the second external connectors 21B are disposed alternately with respect to the third virtual straight line L3. This arrangement prevents the inward elongated portions 22 from overlapping or contacting with each other even when the first inward elongated portions 22a and the second inward elongated portions 22b extend straight perpendicularly to the first virtual straight line L1 or the second virtual straight line L2.

Thus, the straight inward elongated portions 22 can efficiently spread current also into a region relatively distant from the external connectors 21.

In addition, each two first inward elongated portion 22a and second inward elongated portion 22b next to each other face each other in a direction substantially parallel to the first virtual straight line L1 or to the second virtual straight line L2 over a longer length than those of the light-emitting element 100. This arrangement expands a region in which the first inward elongated portions 22a and the second inward elongated portions 22b complement each other in current spreading, and thus non-uniformity of current density in the central region on the light extraction surface can be reduced.

Third Embodiment

Figure 4:
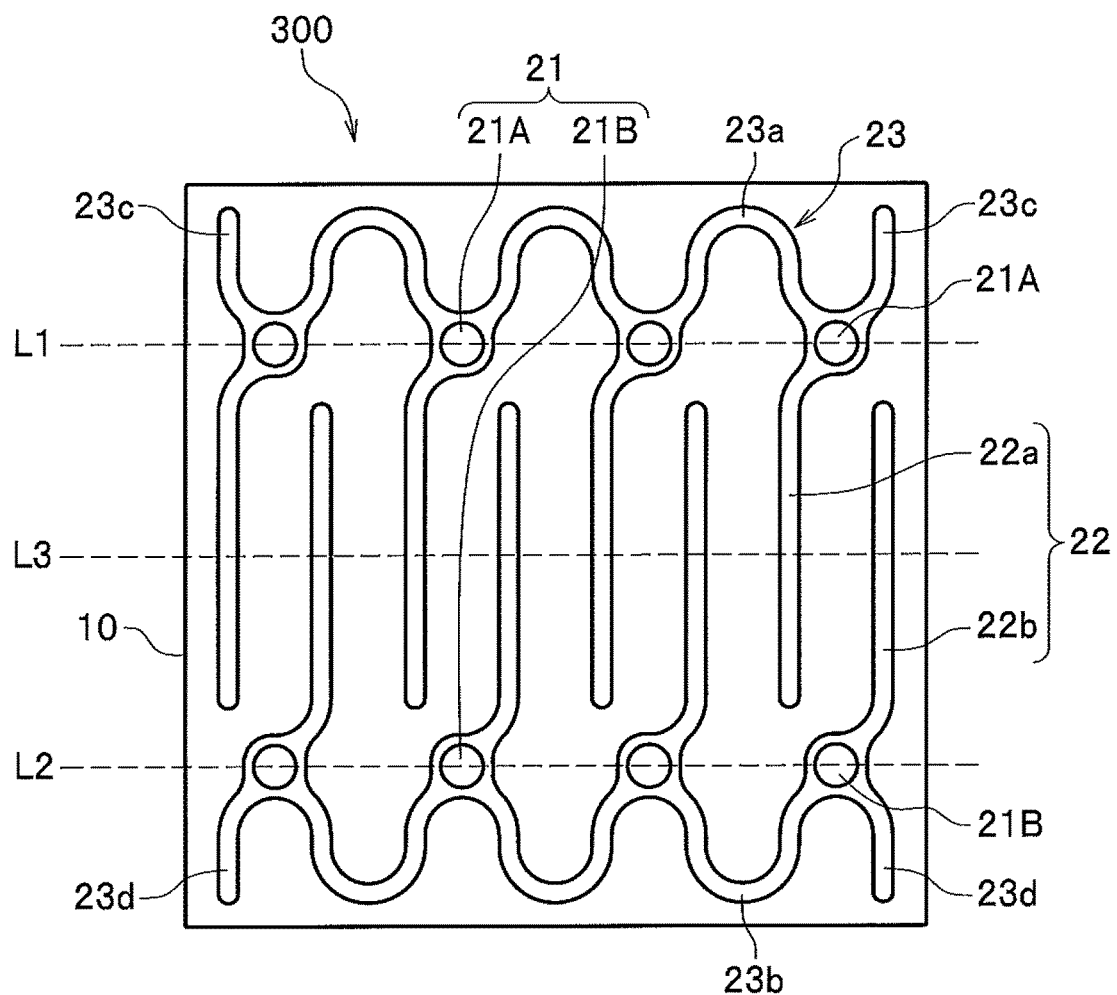
FIG. 4 is a schematic plan view illustrating a light-emitting element according to a third embodiment.

A light-emitting element 300 according to a third embodiment will be described below with reference to FIG. 4. FIG. 4 is a plan view illustrating the light-emitting element 300. The light emitting element 300 has a similar structure as that of the light emitting element 100 except for the arrangement of the upper electrode 20.

As shown in FIG. 4, the upper electrode 20 of the light-emitting element 300 is substantially the same as that of the light-emitting element 100 except that the third inward elongated portions 22c and the fourth inward elongated portions 22d are not provided.

In the light emitting element 100 shown in FIG. 1, the third inward elongated portions 22c, the fourth inward elongated portions 22d, the third outward elongated portions 23c, and the fourth outward elongated portions 23d may not be provided as long as the first external connectors 21A, the second external connectors 21B, the first inward elongated portions 22a, the second inward elongated portions 22b, the first outward elongated portions 23a, and the second outward elongated portions 23b are respectively provided. Further, in the light emitting element 100 shown in FIG. 1, the third outward elongated portions 23c, and the fourth outward elongated portions 23d may not be provided, as long as the first external connectors 21A, the second external connectors 21B, the first inward elongated portions 22a, the second inward elongated portions 22b, the first outward elongated portions 23a, and the second outward elongated portions 23b are respectively provided. In the light emitting element 100 shown in FIG. 1, the third inward elongated portions 22c and the fourth inward elongated portions 22d may not be provided, as long as the first external connectors 21A, the second external connectors 21B, the first inward elongated portions 22a, the second inward elongated portions 22b, the first outward elongated portions 23a, and the second outward elongated portions 23b are respectively provided. In the light emitting elements 200, 300 shown in FIGS. 3 and 4, the third outward elongated portions 23c and the fourth outward elongated portions 23d may not be provided, as long as the first external connectors 21A, the second external connectors 21B, the first inward elongated portions 22a, the second inward elongated portions 22b, the first outward elongated portions 23a, and the second outward elongated portions 23b are respectively provided.

As shown in FIG. 4, the first inward elongated portions 22a each extend to the vicinity of the facing second external connector 21B, and the second inward elongated portions 22b each extend to the vicinity of the facing first external connector 21A. This arrangement causes each two first inward elongated portion 22a and second inward elongated portion 22b next to each other to face each other in a direction substantially parallel to the third virtual straight line L3 over a longer length. Thus, the first inward elongated portions 22a and the second inward elongated portions 22b complement each other in current spreading in a larger region, and thus non-uniformity of current density in the central region can be reduced.

EXAMPLE

An example for verifying an advantage provided by a light-emitting element according to the present invention will be described below with reference to FIGS. 5A to 5C. In this Example, luminance distribution was compared between light extraction surfaces of the respective light-emitting elements. The drawings illustrating the luminance distribution on the light extraction surfaces of the light-emitting elements were generated using a color luminance meter. FIG. 5A is the color bar, an upper portion of the color bar represents a higher luminance.

Example 1

The light-emitting element according to Example 1 is similar to the light-emitting element 100 according to the first embodiment described above. The upper electrode 20 includes the external connectors 21 (21A and 21B), and the inward elongated portions 22 (22a to 22d) and the outward elongated portions 23 (23a to 23d) that extend from the external connectors 21.

Accordingly, the difference between the current density on the light extraction surface in a region inward and the current density on the light extraction surface in a region outward, with respect to the external connectors 21 can be reduced, and thus the current density can be made substantially uniform. As shown in FIG. 5B, non-uniformity of the luminance distribution over the light extraction surface has been reduced.

Comparative Example 1

A light-emitting element according to Comparative Example 1 has an upper electrode that includes external connectors, elongated portions extending inward from the external connectors, elongated portions extending outward from the external connectors, and elongated portions each connects two adjacent external connectors in a straight manner, but the upper electrode does not include the inward elongated portions 22c and 22d nor the outward elongated portions 23a to 23d that have been described in the first embodiment.

Thus, on the light extraction surface, the current density is higher in an inner region and lower in an outer region with respect to the external connectors 21, and thus the difference in the current density is significant. As shown in FIG. 5C, uniform luminance distribution cannot be achieved on the light extraction surface.

INDUSTRIAL APPLICABILITY

The present invention can be applied to any light-emitting apparatus that uses a semiconductor laser element and a device that provides wavelength conversion.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

REFERENCE MARKS IN THE DRAWINGS 100, 200, 300 light-emitting element
10 semiconductor portion 11 first semiconductor layer
12 light-emitting layer
13 second semiconductor layer
20 upper electrode
21 external connector
21A first external connector
21B second external connector
22 inward elongated portion
22a first inward elongated portion
22b second inward elongated portion
22c third inward elongated portion
22d fourth inward elongated portion
23 outward elongated portion
23a first outward elongated portion
23b second outward elongated portion
23c third outward elongated portion
23d fourth outward elongated portion
30 lower electrode
40 support substrate
50 junction layer
60 first protection film
70 second protection film
80 back metalization layer
L1 first virtual straight line
L2 second virtual straight line
L3 third virtual straight line

What is claimed is:

1. A light-emitting element comprising:
a semiconductor portion;
an upper electrode disposed on an upper surface of the semiconductor portion, the upper surface being on a light-extraction side; and
a lower electrode disposed on a lower surface of the semiconductor portion,
wherein
the upper electrode includes, as viewed from above the semiconductor portion,
a plurality of first external connectors arranged on a first virtual straight line,
a plurality of second external connectors arranged on a second virtual straight line substantially parallel to the first virtual straight line,
a first inward elongated portion extending from each of the plurality of first external connectors over a third virtual straight line which is substantially parallel to both the first virtual straight line and the second virtual straight line and divides a region between the first virtual straight line and the second virtual straight line in half,
a second inward elongated portion extending from each of the plurality of second external connectors over the third virtual straight line,
a first outward elongated portion extending from each of the plurality of first external connectors toward a side opposite to a side where the plurality of second external connectors are disposed, and connecting two first external connectors next to each other, and
a second outward elongated portion extending from each of the plurality of second external connectors toward a side opposite to a side where the plurality of first external connectors are disposed, and connecting two second external connectors next to each other.

2. The light-emitting element according to claim 1 further comprising:
a third inward elongated portion extending from each of the plurality of first external connectors toward the third virtual straight line a short of the third virtual straight line, and
a fourth inward elongated portion extending from each of the plurality of second external connectors toward the third virtual straight line a short of the third virtual straight line.

3. The light-emitting element according to claim 2 further comprising:
a third outward elongated portion extending from each of the outermost first external connectors of the plurality of first external connectors toward a side which is outside of the outermost first external connectors and opposite to the side where the plurality of second external connectors are disposed, and
a fourth outward elongated portion extending from each of the outermost second external connectors of the plurality of second external connectors toward a side which is outside of the outermost second external connectors and opposite to the side where the plurality of first external connectors are disposed.

4. The light-emitting element according to claim 3, wherein
the first inward elongated portion and the third inward elongated portion each extend from each of the plurality of first external connectors obliquely relative to the first virtual straight line, and further extend perpendicularly to the first virtual straight line, and
the second inward elongated portion and the fourth inward elongated portion each extend from each of the plurality of second external connectors obliquely relative to the second virtual straight line, and further extend perpendicularly to the second virtual straight line.

5. The light-emitting element according to claim 3, wherein each of the plurality of the first inward elongated portions and its corresponding fourth inward elongated portion are extended on a virtual straight line, and the second inward elongated portion and the third inward elongated portion are extended on a same virtual straight line.

6. The light-emitting element according to claim 5, wherein the first inward elongated portions, the second inward elongated portions, the third inward elongated portions, and the fourth inward elongated portions are arranged to avoid contact with each other.

7. The light-emitting element according to claim 2, wherein the first inward elongated portion and the third inward elongated portion each extend from each of the plurality of first external connectors obliquely relative to the first virtual straight line, and further extend perpendicularly to the first virtual straight line, and the second inward elongated portion and the fourth inward elongated portion each extend from each of the plurality of second external connectors obliquely relative to the second virtual straight line, and further extend perpendicularly to the second virtual straight line.

8. The light-emitting element according to claim 7, wherein the first inward elongated portions each faces the second external connector in a perpendicular direction to the second virtual straight line, and the second inward elongated portions each faces the first external connector in a perpendicular direction to the first virtual straight line.

9. The light-emitting element according to claim 2, wherein each of the plurality of the first inward elongated portions and its corresponding fourth inward elongated portion are extended on a virtual straight line, and the second inward elongated portion and the third inward elongated portion are extended on a same virtual straight line.

10. The light-emitting element according to claim 9, wherein the first inward elongated portions, the second inward elongated portions, the third inward elongated portions, and the fourth inward elongated portions are arranged to avoid contact with each other.

11. The light-emitting element according to claim 1 further comprising:
 a third outward elongated portion extending from each of the outermost first external connectors of the plurality of first external connectors toward a side which is outside of the outermost first external connectors and opposite to the side where the plurality of second external connectors are disposed, and
 a fourth outward elongated portion extending from each of the outermost second external connectors of the plurality of second external connectors toward a side which is outside of the outermost second external connectors and opposite to the side where the plurality of first external connectors are disposed.

12. The light-emitting element according to claim 11, wherein the first outward elongated portions and the second outward elongated portions are arranged alternately with respect to the third virtual straight line.

13. The light-emitting element according to claim 1, wherein the first outward elongated portions and the second outward elongated portions are arranged alternately with respect to the third virtual straight line.

14. The light-emitting element according to claim 13, wherein the first inward elongated portions each faces the second external connector in a perpendicular direction to the second virtual straight line, and the second inward elongated portions each faces the first external connector in a perpendicular direction to the first virtual straight line.

15. The light-emitting element according to claim 1, wherein the upper electrode is arranged with a rotational symmetry about the center of the upper surface of the semiconductor portion.

16. The light-emitting element according to claim 1, wherein the semiconductor portion has a stacked structure of a second semiconductor layer, a light-emitting layer, and a first semiconductor layer in this order from bottom to top, the upper electrode is an n-type electrode to be connected to the first semiconductor layer, and the lower electrode is a p-type electrode to be connected to the second semiconductor layer.

17. The light-emitting element according to claim 1, wherein the upper surface of the semiconductor portion has a rectangular shape as viewed from the upper surface side, and the first virtual straight line and the second virtual straight line are substantially parallel to a common side of the periphery of the semiconductor portion.

\* \* \* \* \*